United States Patent
Balachandran

(10) Patent No.: US 6,553,329 B2
(45) Date of Patent: Apr. 22, 2003

(54) SYSTEM FOR MAPPING LOGICAL FUNCTIONAL TEST DATA OF LOGICAL INTEGRATED CIRCUITS TO PHYSICAL REPRESENTATION USING PRUNED DIAGNOSTIC LIST

(75) Inventor: Hari Balachandran, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 180 days.

(21) Appl. No.: 09/732,339

(22) Filed: Dec. 7, 2000

(65) Prior Publication Data

US 2002/0010560 A1 Jan. 24, 2002

Related U.S. Application Data

(60) Provisional application No. 60/170,364, filed on Dec. 13, 1999.

(51) Int. Cl.[7] .............................................. G01R 31/00
(52) U.S. Cl. ..................................................... 702/118
(58) Field of Search ................................. 702/118, 121, 702/182, 183, 185; 714/718, 720, 723

(56) References Cited

U.S. PATENT DOCUMENTS 6,185,707 B1 * 2/2001 Smith et al. ................. 714/724
2002/0144219 A1 * 10/2002 Zachariah et al. ............. 716/4

* cited by examiner

Primary Examiner—Michael Nghiem
(74) Attorney, Agent, or Firm—Robert L. Troike; Frederick J. Telecky, Jr.

(57) ABSTRACT

An improved method for mapping logical function test data of logical integrated circuits to physical representations uses a pruned diagnostic list. The steps include creating a final logical diagnostic list of potential bridging faults in response to testing the circuit for stuck-at faults at a plurality of nets of the circuit, receiving the physical data associated with nets of the circuit, applying adjacency criteria to the physical data, generating a pruned diagnostic list of potential bridging faults in response to applying the adjacency criteria, performing in-line inspection to obtain second localized probable defect data and correlating second localized portable defect data with the pruned diagnostic list.

10 Claims, 4 Drawing Sheets

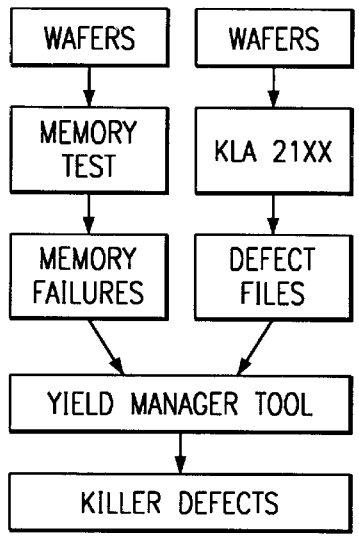

FIG. 1
*(PRIOR ART)*

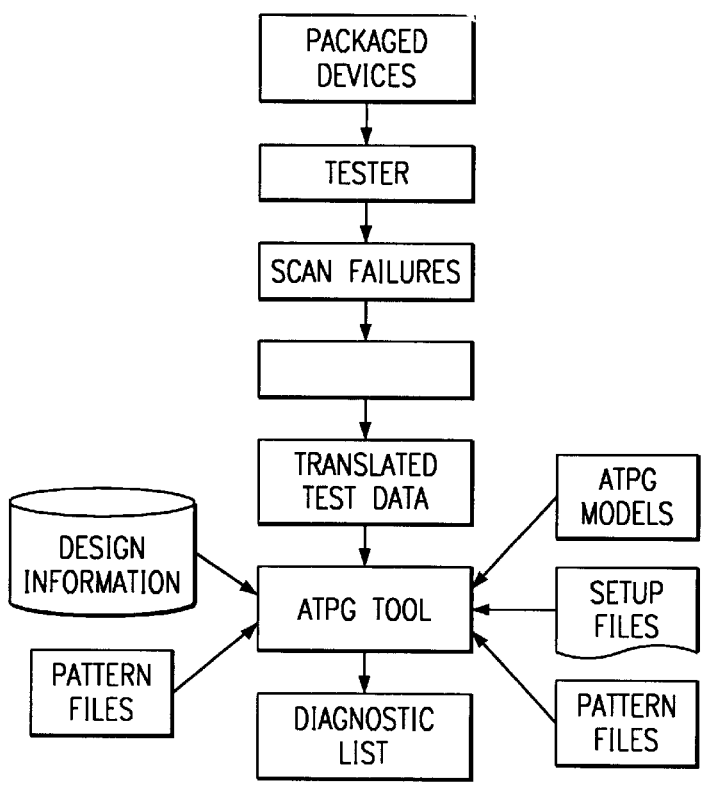

FIG. 2
*(PRIOR ART)*

```
DeviceID = DEMOID
LotID = TESTLOT01
WaferID = 01
DIE = -4,0
datalog.scan.10 diagnosis summary, #failing_patterns=9 #defects=2
#unexplained_fails=2
unexplained patterns = 212 250
```

--- fault candidates for defect 1, #failing_patterns_explained=5

---

Warning: Fault candidates will cause passing patterns to fail.
failing patterns explained = 322 706 738 770

| type | code | pin_pathname |
|------|------|--------------|
| 1 | DS | /XTIO_0/XTTLI8_1612/N2_23 |
| 1 | DS | /PI9 |

--- diagnosis CPU time = .68 sec

FIG. 3
*(PRIOR ART)*

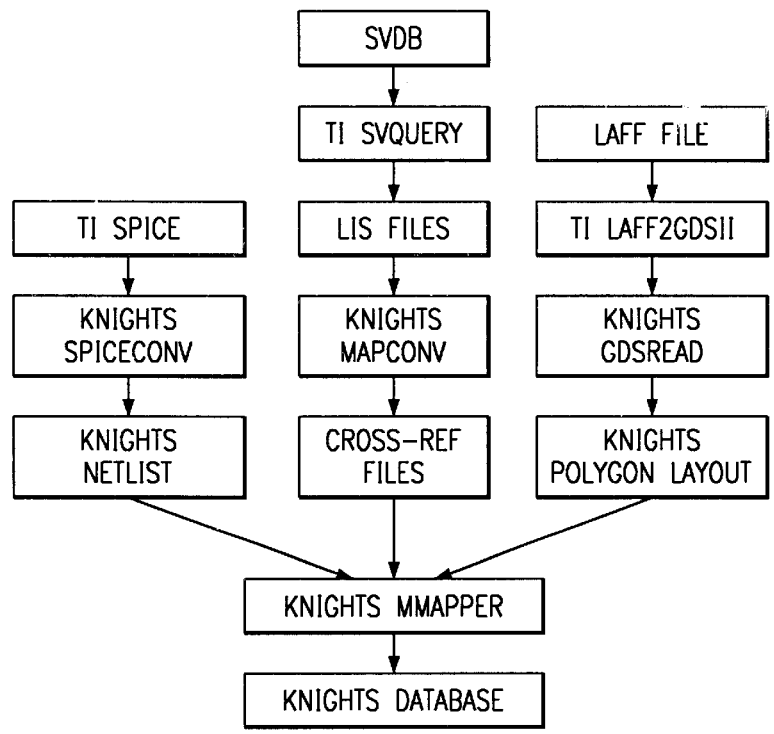
FIG. 4
(PRIOR ART)
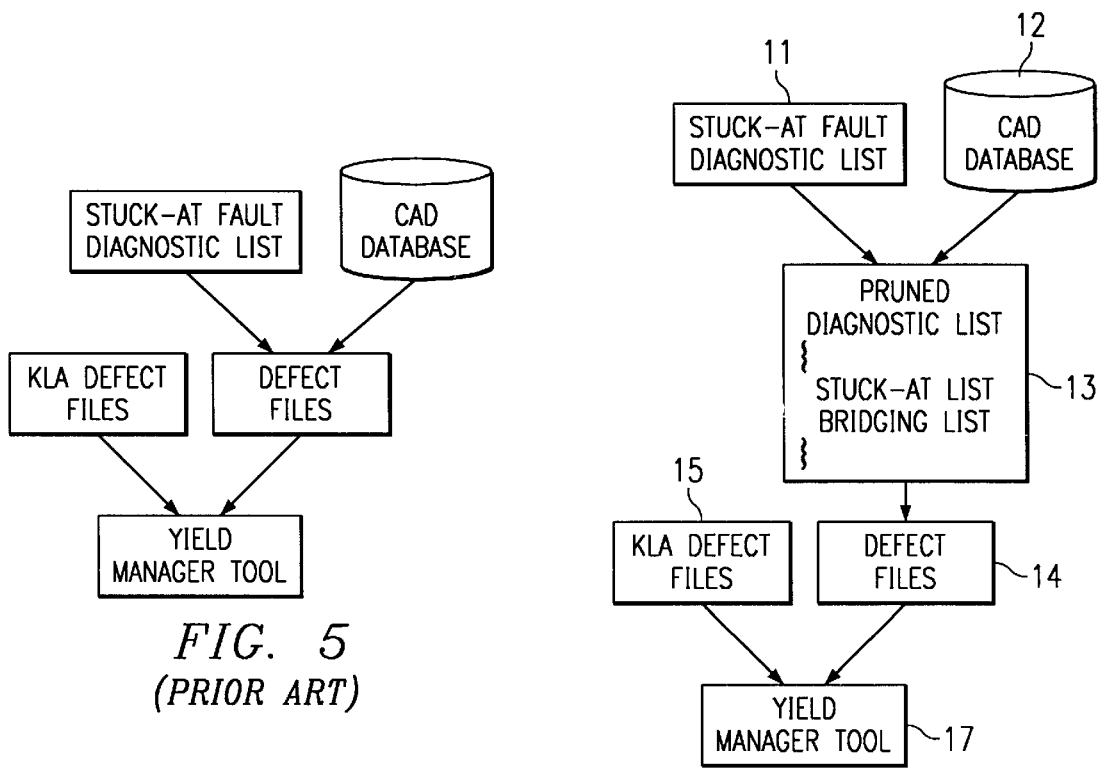
FIG. 5
(PRIOR ART)
FIG. 6

SYSTEM FOR MAPPING LOGICAL FUNCTIONAL TEST DATA OF LOGICAL INTEGRATED CIRCUITS TO PHYSICAL REPRESENTATION USING PRUNED DIAGNOSTIC LIST

This application claims priority under 35 USC §119(e)(1) of provisional application No. 60/170,364, filed Dec. 13, 1999.

FIELD OF INVENTION

This invention relates to integrated circuit (IC) chip test software systems and more particularly to refining logic bitmap using pruned diagnostic list.

BACKGROUND OF INVENTION

Digital semiconductor integrated circuits are manufactured on dies of a silicon wafer. There are both memory chips and logic chips. A microprocessor chip is an example of a logic chip. A field known as Design for Test (DFT) involves designing into the chip "scan chains" that are used to write and read portions of the chip that might be otherwise inaccessible. Layout tools are used to lay out a chip design onto the silicon wafer. The chip layout may be represented in the form of a netlist which is a bit of low-level design cells and the interconnections between them. Once the design is completed, the bits of a file representing the chip are written to a tape or disk. A mask maker makes photomasks to manufacture the chip using the files.

The chips are production monitored and tested. Production monitoring is performed using "in-line" inspection equipment and production testing is performed using "end-of-line" test equipment. In-line inspection equipment inspects the entire semiconductor wafer, each of which may have hundreds of chips. The end-of-line test equipment performs what is called "binsort function test" on the semiconductor wafers wherein the pads of the chip are contacted by test equipment and the chips are operated. At the conclusion of the test, parts are "binned" or placed in different categories within an electronic record according to test result. The categories relate to the quality of the chip (bad, good, high quality, etc.).

Failure analysis attempts to identify the cause of failure of chips of a particular chip design after the failures have been detected during production or prototype testing. Failure analysis usually requires more detailed failure information than just a bin code. Detailed failure information is typically obtained by re-testing a number of packaged parts.

Memory chips in reality lend themselves to failure analysis because of their structure as regular arrays of memory cells. A memory chip may be tested by a series of read and write questions to the memory chip. The errors in read/write testing pin-point likely physical defects at readily identified location. Alternatively, the memory chip can have built in self test (BIST) capabilities. The functional test results can be "bitmapped" to failure locations on the memory chip. In memory bitmapping, electrical failures are realized within relatively small physical "trace" on the die.

FIG. 1 illustrates the process flow with conventional bitmap testing wherein the wafer undergoes in-line inspection (right column) and end-of-line testing (left-hand column). This in-line testing may be done using optical test equipment like KLA21xx from KLA Tencor to produce defect files containing X, Y location defect information. End-of-line testing is performed by Automatic Test Equipment (ATE), which identifies failed memory locations. This is processed to identify X, Y defect locations. The X, Y defect information may be output to a Yield Manager tool. Because these are in the same format within the Yield Manager tool, a combined defect overlay is obtained to determine "killer defects" or defects that render a part non-functional to be identified. The locations of a defect and a failure coincide. As a result of this identification, troubleshooting would focus on the production process rather than the design of the part.

In recent years, the market share of logic products has increased with many new "logic only" semiconductor fabs without the benefit of a "memory production line to monitor the production process and take advantage of the yield enhancement technique developed within the industry." There has been no way to "bitmap" area of logic within a chip. Furthermore, logic chip function test results do not provide a starting point for the physical coordinates of failures within a failed die.

The most advanced logic chip designs contain scan testing. Scan testing breaks the logic real estate of a chip into many discrete chains of logic which can be tested individually for basic functionality. Scan testing enables a list of failing signals to be identified. However, even after a list of failing signals is produced for a given dies, it is still not possible to find the physical location of the failure because each failing signal may contain hundreds of transistors within its "cone of logic," and there are usually multiple failing signals. Traditional logic chip yield enhancement techniques therefore rely heavily on correlation of binsort functional test results to anticipate and correct semiconductor process issues. This approach suffers from several drawbacks, including: the inability to relate a particular bin's fall-out to a suspect process level; the inability to distinguish pre-packaging yield issue from packaging yield issues; and the inability to establish a clear link between large populations of failed die.

Failure analysis may make use of a known electrical diagnosis process whereby a diagnostic list of suspected failing nets may be obtained as shown in FIG. 2. Packaged devices having BIST (scan) capabilities are tested using a tester. Scan failure data is translated into format that can be used by an ATPG (Automatic Test Pattern Generation) tool, e.g., an ATPG tool used previously to generate test pattern files used by the tester. The ATPG tools use the translated test data, together with the test pattern files, setup files, one or more ATPG diagnostic models, and design information from a design database in order to identify suspected failing nodes, output in the form of a diagnostic list (FIG. 3).

CAD navigation tools have been developed to aid in failure analysis. CAD navigation refers to the ability to point and click within a circuit layout display and by so doing automatically drive a piece of equipment such as FIB (Focussed Ion Beam) equipment to that location on the chip. CAD navigation also allows a user to specify the name of a net, causing the corresponding layout to be displayed. Once such CAD navigation tool is the Merlin Framework CAD navigation tool of Knights Technology. This tool takes netlist information, layout information, and cross-reference files relating the two and procedures a unified database in a Knights-proprietary format having an efficient indexing structure. Referring more particularly to FIG. 4, the process of creating such a Knights database is illustrated in greater detail. A SPICE-formatted netlist is converted (if required) to a suitable netlist format. Data from a Schematic Verification database is converted (if required) to obtain cross-reference files cross-referencing net names and numerical net identifiers. Layout data is converted (if required) to a suitable polygon layout format. An MMapper routine uses the netlist, cross-reference files and polygon layout files in the following manner to produce a database suitable for CAD navigation.

In a co-pending application Ser. No. 09/192,164 filed Nov. 13, 1998 (now U.S. Pat. No. 6,185,707B1), of Shawn Smith, Han Balachandran and Jason Parker entitled, "IC Test Software System for Mapping Logical Functional Test Data of Logic Integrated Circuits to Physical Representation," incorporated herein by reference, takes advantage of the foregoing capability to determine and display the X,Y location corresponding to a net name, by translating functional test data of a digital logic chip passed through a simulation model which identifies one or more defective nets of the chip. The defective nets are processed against a database of the type to obtain X, Y coordinate data for these nets, allowing them to be data tagged as physical traces on the chip layout. The mapping is performed by taking the output from a functional tester and translating it form a list of failed scan chains into a list of suspected netlist nodes. The X, Y coordinates of suspected netlist nodes are then identified and stored in a database, providing failure analysis and yield enhancement engineers a starting point for performing failure analysis and for understanding whether "in-line" inspection data can account for a given failure.

Presently, logic bitmap is performed using a stuck-at fault list. In a stuck-at fault testing model, various nets of the circuit are tested by applying patterns of values inserted via the scan cells to determine if appropriate voltage values are obtained at the nets. For example, if a series of values is applied to the scan cells within the circuit such that the voltage value at a particular net should be at a high voltage level, but the voltage level at the particular net remains at a low voltage level, a stuck-at fault is detected. Given information about a particular circuit's design, manufacture, and logic flow, a stuck-at fault dictionary can be generated containing entries for each particular net that shows how the circuit would respond in the presence of those stuck-at-faults. Such flaws may include, but are not limited to, pin faults, element failures, metallization failures, improper metal oxidation, or incorrect ion implantation.

However, not all problems in a circuit can be detected using stuck-at fault testing models. Stuck-at fault models may not present a design or manufacturing team with sufficient information to easily determine the causes of particular faults that are detected in a circuit. Other faults, known as bridging faults, include faults that are the result of defects or failures involving more than one particular net. For example, two metal leads within a particular circuit layer or in adjacent circuit layers may be shorted, causing a fault that may not be easily detected or diagnosed using a stuck-at fault model of testing. The problem with this methodology is that the confidence level of the stuck-at diagnostic tools is only between fifty and seventy percent.

SUMMARY OF INVENTION

In accordance with one embodiment of the present invention, the net/node information given by the bridging/stuck-at diagnostic tools is combined with the susceptible bridging candidates extracted from the layout information. The bridging candidate extraction needs to be performed only on those nets reported by the diagnosis tool. A pruned bridging and stuck-at diagnostic list is then used to perform defect matching.

DESCRIPTION OF THE DRAWINGS

FIG. 1 illustrates process flow with conventional bitmap testing;

FIG. 2 is a block diagram of a known electrical process flow;

FIG. 3 is an example net/node list obtained through stuck-at diagnosis;

FIG. 4 is a more detailed flow diagram illustrating the manner in which a known database suitable for CAD navigation is produced;

FIG. 5 illustrates a prior logic bitmap flow using a stuck-at fault diagnostic list;

FIG. 6 illustrates the method according to one embodiment of the present invention;

DESCRIPTION OF PREFERRED EMBODIMENTS OF THE PRESENT INVENTION

Referring to FIG. 5, there is illustrated the logic bitmap flow using stuck-at fault diagnostic list. The defects are collected using, for example, a KLA 21xx in-line manufacturing equipment. This is applied as one input to the Yield Management tool. The other input to overlay is provided by the stuck-at fault diagnostic list and the Computer Aided Design (CAD) database using a commercially available ATPG tool. The ATPG tool uses the translated test data, together with the test pattern files, set-up files, one or more ATPG diagnostic models, and design information from the design database to identify suspected failing nodes, output from the diagnostic list. For more information, refer to application Ser. No. 09/192,164, filed Nov. 13, 1998 of Shawn Smith, Hari Balachandran and Jason Parker entitled "IC Test Software System for Mapping Logical Functional Test Data of Logic Integrated Circuits to Physical Representation" incorporated herein by reference.

Figure 7:
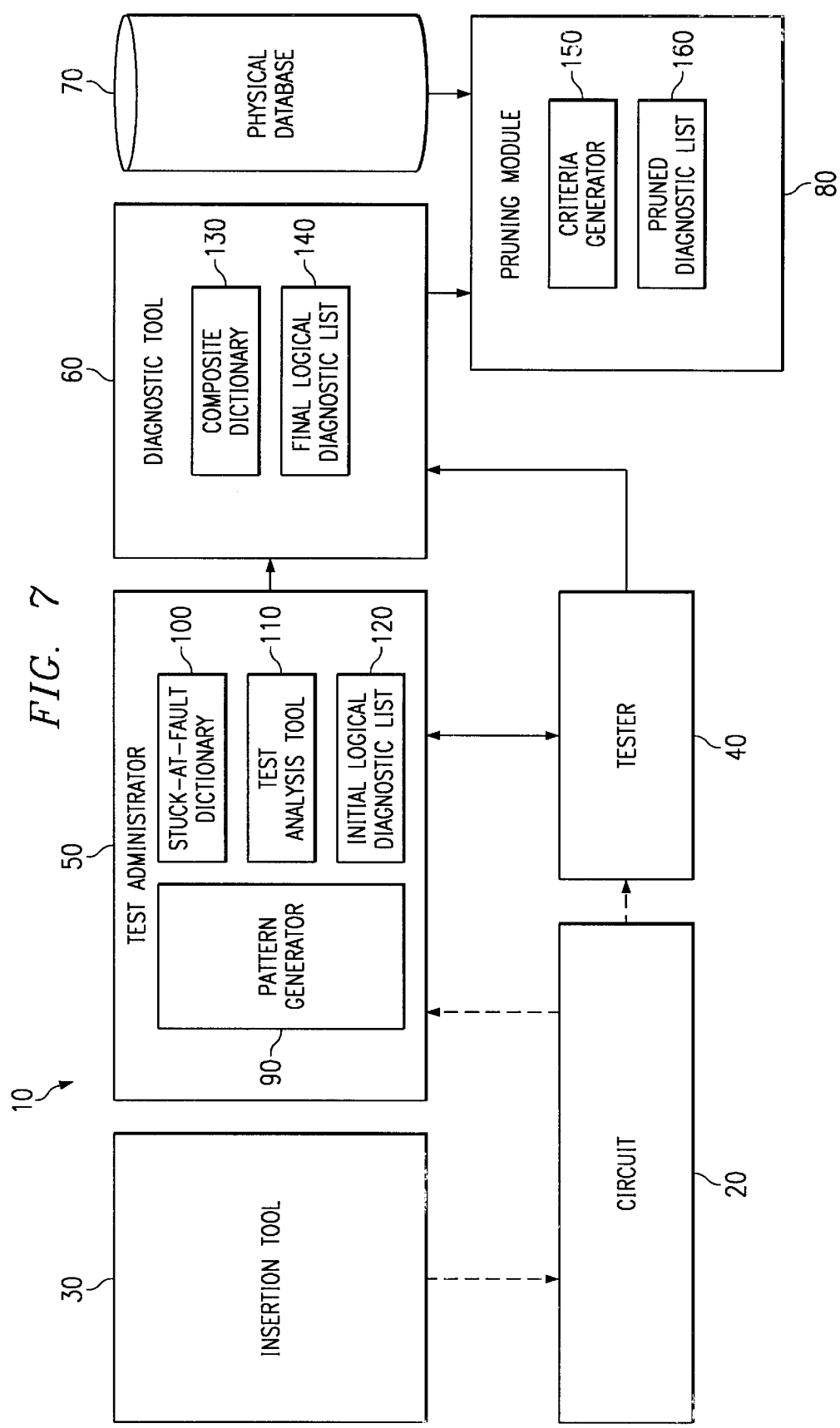
FIG. 7 is a block diagram of a system for pruning a bridging diagnostic list.
Figure 8:
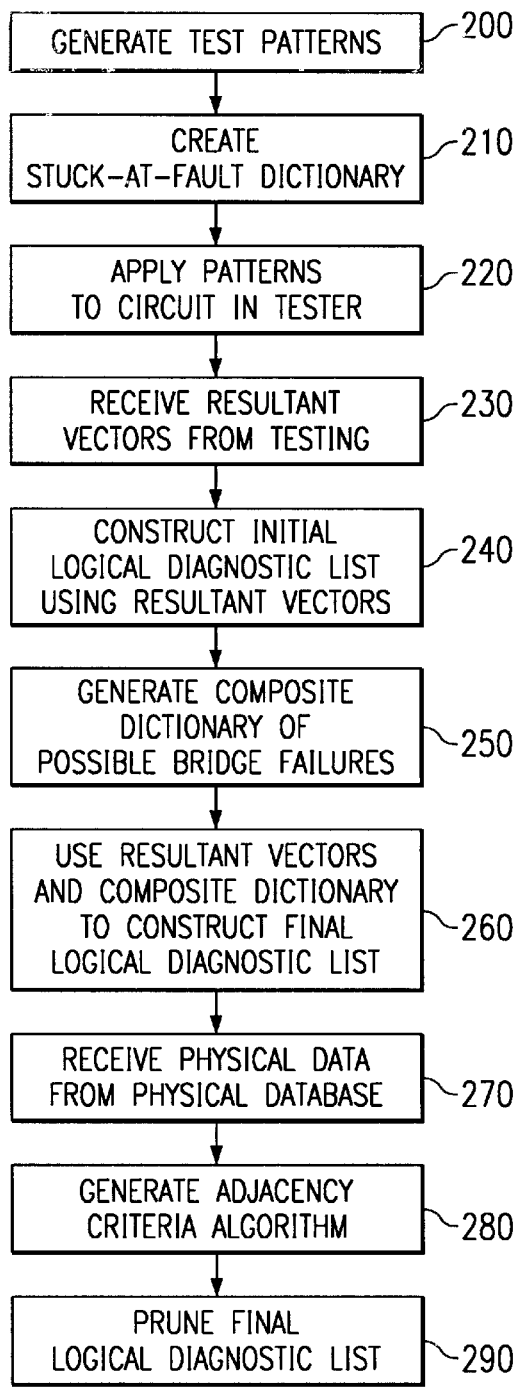
FIG. 8 is a flow chart of a method for pruning a bridging diagnostic list.
Figure 9:
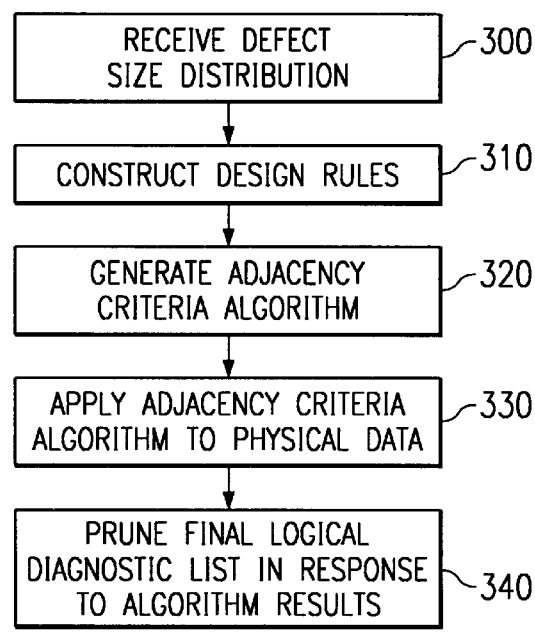
FIG. 9 is a more detailed flow chart of pruning a final logical diagnostic list.

In accordance with the preferred embodiment of the present invention, a pruned diagnostic list is used for defect matching. The proposed bitmap flow is illustrated in FIG. 6 wherein the stuck-at fault diagnostic list 11 and CAD database 12 are inputs to the pruned diagnostic list 13. The pruning system is illustrated in FIG. 7 and the steps are illustrated in FIGS. 8 and 9. The pruning is described below and in patent application Ser. No. 09/452,092, filed Nov. 30, 1999 (provisional application serial No. 60/110,324, filed Nov. 30, 1998 (TI-28287)), entitled "System and Method for Pruning a Bridging Diagnostic List" of Han Balachandrian, incorporated herein by reference. The defect files 14 from the pruned diagnostic list 13 are overlapped with the "in-line" defect files 15 from, for example, KLA 21xx at the Yield Manager Tool 17 are used to correlate defect data. See FIG. 6.

A description of the pruning system and the pruning steps follow.

FIG. 7 is a block diagram of system 10 for pruning a bridging diagnostic list in response to the testing of and physical data associated with a circuit 20. System 10 includes an insertion tool 30 for preparing circuit 20 for testing in a tester 40. Tester 40 is in communication with a test administrator 50 and a diagnostic tool 60. Diagnostic tool 60 is also in communication with test administrator 50 and a pruning module 80. Pruning module 80 is also in communication with a physical database 70. In general, system 10 generates diagnostic information using stuck-at fault testing, converts the diagnostic information into refined diagnostic information suggesting possible bridge faults, and then prunes such refined diagnostic information in response to the physical data associated with circuit 20.

Insertion tool 30 can be any commercially available insertion tool for inserting scan cells and/or any other testing element necessary to allow circuit 20, and more specifically the nets within circuit 20, to be tested by tester 40. Insertion tool 30 generally inserts scan cells during the design process of circuit 20, and as such, is not required to communicate with test administrator 50, tester 40, or any other component of system 10.

Tester 40 is an automatic test equipment device capable of detecting potential faults in circuit 20 using scan cells or other inserted testing elements. More particularly, tester 40 is an automatic test equipment capable of detecting the nets of circuit 20 using a stuck-at fault model of testing. In one embodiment, tester 40 responds to testing patterns received from test administrator 50 in a test description language interpretable by tester 40. Using scan cells, tester 40 can shift a specific logic or voltage pattern into circuit 20 for determining the presence of stuck-at faults at specific nets of circuit 20. For example, tester 40 can shift a specific testing pattern into circuit 20 such that a given net of circuit 20 should have an expected value corresponding to a high logic level. Tester 40 is further operable to supply the results of the test to test administrator 50 in the form of a resultant vector of data or scan failure vector for each tested pattern. Tester 40 may be, for example, automatic test equipment manufactured by Teradyne such as the J971 and A580 devices.

Test administrator 50 is a tool, system, or device, or a specific or general purpose computing platform that includes a pattern generator 90, a stuck-at fault dictionary 100, and a test analysis tool 110. In general, pattern generator 90 generates patterns of test values to be used by tester 40 to evaluate potential faults at specific nets of circuit 20. Resultant vectors applied by tester 40 are then evaluated by test analysis tool 110 relative to the nets of circuit 20 listed in stuck-at fault dictionary 100 to create an initial logical diagnostic list 120. Initial logical diagnostic list 120 includes specific nets of circuit 120 that test analysis tool 110 has identified as being associated with a particular circuit fault or defect. Test administrator 50, may be, for example, Mentor Graphics' FastScan™. Alternatively, test administrator 50 may be a combination of Synopsis' Test Compiler™, TestGen™ and Sherloc™.

Test administrator 50 may include a pattern generator 90 which may be a device or an application, module or subsystem. In general, pattern generator 90 generates patterns of voltage or logic values to be scanned into or applied by circuit 20 by tester 40. Such test patterns may be generated in response to design information of the particular circuit 20, automatic test pattern generation models, and/or pattern files and setup files stored within pattern generator 90. More specifically, each test pattern is an array of inputs expected to generate a corresponding array of theoretically expected outputs. When an expected output does not occur, a potential fault, such as a stuck-at fault, is indicated. Combinations of test patterns are used to identify stuck-at faults at particular nets as a result of design or manufacturing failures or defects.

Stuck-at fault dictionary 100 may be a library, file, record, listing or other combination of data that includes a list of each net in circuit 20 and associated testing results that would correspond to a stuck at fault in each net. More specifically, stuck-at fault dictionary 100 includes two entries for each net of a particular circuit. The first entry includes test patterns and associated expected responses to such test patterns that are used by test analysis tool 110 for comparison with resultant vectors generated by tester 40 to determine whether or not the particular net is stuck at a low voltage level. The second entry includes test patterns and associated expected responses to such test patterns that are used by test analysis tool 110 for comparison with resultant vectors generated by tester 40 to determine whether or not the particular net is stuck at a high voltage level. The expected responses may be referred to hereafter as expected responses or as resultant vectors that are stored in stuck-at fault dictionary 100. Such stored resultant vectors are really expected results of the resultant vectors generated by tester 40 that can then be compared to the actual resultant vectors so generated. Stuck-at fault dictionary 100 is generated in response to the circuit design and/or logical map of circuit 20 and the test patterns to be applied to such circuit 20. Stuck-at fault dictionary 100 is used by test analysis tool 110 to prepare initial logical diagnostic list 120 and is also provided by test administrator 50 to diagnostic tool 60.

Test analysis tool 110 is a separate device or an integrated diagnostic application, module or system within test administrator 50. Test analysis tool 110 is included within some commercial test administration tools such as FastScan™ or may be a separate tool or device such as Synopsys' Sherloc™. Test analysis tool 110 derives initial logical diagnostic list 120 from the resultant vectors generated by tester 40. More specifically, test analysis tool 110 combines, for each net, resultant vectors from at least one set of test patterns and compares them with expected responses to test patterns stored in stuck-at fault dictionary 100 to determine the likelihood of a particular stuck-at fault occurring at the net. Thus, for example, examining the resultant vectors associated with TEST 1, TEST 6, and TEST 14 of NET 1 and comparing them with the expected responses of test patterns stored in stuck-at fault dictionary 100 may show a match among these resultant vectors. Such a match would indicate a potential stuck-at fault at NET 1.

Initial logical diagnostic list 120 is a file, record, listing or other combination of data wherein test analysis tool 110 can store a list of nets of circuit 20 identified as having potential faults by test analysis tool 110 as described above. Initial logical diagnostic list is supplied by test administrator 50 to diagnostic tool 60 to aid in identifying possible bridging faults within circuit 20.

Diagnostic tool 60 is a tool, system, or device including one or more processors, memory, and other applications or routines capable of analyzing and processing data received from test administrator 50 and tester 40 to prepare a list of final candidates for potential bridging faults to be evaluated by pruning module 80. One example of diagnostic tool 60 is University of California at Santa Cruz's Sproing™ tool. In general, diagnostic tool 60 uses stuck-at fault dictionary 100 and initial logical diagnostic list 120 to create a composite dictionary 130 that includes listings of potential bridging faults involving one of the nets identified within an initial logical diagnostic list 120 as well as associated test patterns and corresponding resultant vectors. A ranked list of possible bridging fault candidates is then prepared by diagnostic tool 60 using composite dictionary 130 and the resultant vectors received from tester 40. Essentially, diagnostic tool 60 reexamines the resultant vectors in light of composite dictionary entries for particular bridging faults to determine the logical likelihood that such bridging faults are present. The ranked list is stored as final logical diagnostic list 140 as described below.

Composite dictionary 130 is a library, file, record, listing or other combination of data that is created by diagnostic tool 60 to include a list of potential bridging faults for each of the nets identified within initial logic diagnostic list 120 together with resultant vectors associated with particular test patterns. More specifically, composite dictionary 130 takes each net identified in initial logical diagnostic list 120 and pairs it up with every other net within circuit 20 as identified within stuck-at fault dictionary 100 to create an array or list of potential bridging faults associated with each identified net. Diagnostic tool 60 includes test patterns and corresponding resultant vectors from stuck-at fault dictionary 100 for each net associated with each potential bridging fault that is listed in composite dictionary 130. Each listed bridging fault thus contains both stuck-at fault entries from stuck-at fault dictionary 100 for each net included within the potential bridge. For example, a potential bridging fault between NET 1 and NET 2 may include entries from stuck-at fault dictionary 100 for each of NET 1 and NET 2. Thus, each potential bridging fault listed in composite dictionary 130 may list NET 1 stuck at low and its associated vectors, NET 1 stuck at high and its associated vectors, NET 2 stuck at low and its associated vectors, NET 2 stuck at high and its associated vectors. Thus, composite dictionary 130 uses both stuck-at fault dictionary 100 and initial logical diagnostic list 120 to create a bridge fault model based entirely upon a stuck-at fault model and stuck-at fault testing results.

Final logical diagnostic list 140 is a library, file, record, listing and/or other combination data created by diagnostic tool 60 that includes a ranked list of all potential bridge faults in a particular circuit 20 that is derived from stuck-at fault dictionary 100, initial logical diagnostic list 120, and resultant vectors from tester 40. Diagnostic tool 60 ranks potential bridging faults in final logical diagnostic list 140 by comparing resultant vectors associated a potential bridging fault in composite dictionary 130 with the corresponding resultant vectors received from tester 40 to determine if the behavior of the nets of the potential bridging fault are consistent with an actual bridging fault.

Physical database 70 is a database or other library, file, record, listing or other combination of data containing information representative of the physical layout of the particular circuit 20 being tested. Physical database 70 may contain the geographical coordinates, or means of deriving same, of each net within circuit 20. Thus, each particular net within circuit 20 are identifiable based on a coordinate map which may correspond to the physical dimensions of a particular circuit 20. A particular net may be identified based on its length, width and depth, and at a minimum, should include the horizontal and vertical dimensions and position of the net within circuit 20. Physical database 70 may include other physical, layout, or material characteristics of circuit 20. Physical database 70 may, for example, be a query database or other database within a failure analysis tool such as Knight's Merlin™.

Pruning module 80 is or is part of a specific or general purpose computing platform including means for processing, data storage, and execution of specific routines and applications. Pruning module 80 includes criteria generator 150 and pruned diagnostic list 160. In general, pruning module 80 utilizes an adjacency criteria generated by criteria generator 150 that is specific to the particular circuit 20 to create pruned diagnostic list 160 from final logical diagnostic list 140 and physical data of the particular circuit 20 from physical database 70. Pruned diagnostic list 160 can then be used by a design, testing or manufacturing team to evaluate specific failures or defects associated with potential bridge faults identifying within prune diagnostic list 160.

Criteria generator 150 is a separate device or application, routine, or sub-module of pruning module 80 that generates an adjacency criteria algorithm in response to the design rules of a particular circuit 20 and defect size distribution within the particular circuit 20.

Design rules, for example, may include restrictions made by the design team of a particular circuit 20 that specify that the metal line pitch, or distance between the center of one metal lead or metallization layer and an adjacent metal lead or metallization layer be no less than 1.5 microns in length. Such a pitch restriction may be imposed on a particular circuit 20 to limit the amount of cross talk or electrical noise from one layer of metallization to another. Other design rules may relate to the gate size employed within a particular circuit 20. For example, circuits utilizing gate size of 0.6 microns in width may have different requirements with respect to the distance between particular metal or semiconductor layers than in those utilizing 0.8 micron gate technology.

Defect size distribution data presents data indicating the probability that a defect of a particular size is possible within circuit 20. Defect size distribution data may thus be embodied by a list of defect sizes and/or a list of ranges of defect sizes each together with an estimated probability that such size or range will be present in circuit 20. Such defects may, for example, refer to defects on a particular silicon wafer where the die containing circuit 20 was manufactured. Using such design rules and defect distribution data, criteria generator 150 generates an adjacency criteria algorithm to evaluate the distances between two nets to determine if the two nets are physical candidates for a potential bridging fault.

Pruned diagnostic list 160 is a library, file, record, listing or other combination of data generated by pruning module 80 from final logical diagnostic list 140. Whereas final logical diagnostic list 140 includes an array of every potential bridging fault possible based on the resultant vectors generated by tester 40, pruned diagnostic list 160 may have a subset of these bridging faults. Pruned diagnostic list 160 is a reduced list of potential bridging faults from almost several hundred potential bridges to a much smaller set of bridges. Pruned diagnostic list 160 is consistent with physical data and maybe more easily examined using a physical diagnostic tool. It should be noted that pruning module 80 can be configured such that any number of potential bridging fault candidates may be included in pruned diagnostic list 160. Pruning module 80, for example, may only identify the ten most likely bridge faults to be included in a particular file or display. Likewise, pruning module 80 can be configured to simply re-ranking the individual potential bridge faults.

In operation, test administrator 50 applies test patterns generated by pattern generator 90 to a particular circuit 20 using tester 40. The resultant vectors from tester 40 are then supplied to test administrator 50 for analysis by test analysis tool 110. Test analysis tool 110 combines, for each net of circuit 20, resultant vectors from at least one set of test patterns and compares them with resultant vectors of test patterns stored in stuck-at fault dictionary 100 to determine the likelihood of a particular stuck-at fault occurring at the net. Test analysis tool 110 then generates initial logical diagnostic list 120 that includes the nets that it has identified as containing potential stuck-at faults.

Test administrator 50 then supplies initial logical diagnostic list 120 and stuck-at fault dictionary 100 to diagnostic tool 60. Diagnostic tool 60 then constructs composite dictionary 130 that includes a listing of all potential bridging faults associated with the nets identified in initial logical diagnostic list 120. Composite dictionary 130 uses stuck-at fault dictionary 100 to integrate test patterns and associated resultant vectors that indicate potential'stuck-at faults for each net making up a particular potential bridging fault and attaches the integrated information to each bridging fault entry in composite dictionary 130. Diagnostic tool 60 then compares the information within composite dictionary 130 for each potential bridging fault with the resultant vectors from tester 40 to generate a ranked final logical diagnostic list 140 of all potential bridging faults associated with the nets originally identified in initial logical diagnostic list 120. Diagnostic tool 60 ranks such potential bridging faults by comparing different resultant vectors.

Diagnostic tool 60 then supplies final logical diagnostic list 140 to pruning module 80. Physical database 70 also supplies pruning module 80 with physical data, such physical data including geographical location and dimensions of each net within circuit 20. Such information is referred to in the semiconductor industry as polygon information for each net. Pruning module 80 uses the adjacency criteria algorithm generated by criteria generator 150 to evaluate the potential bridging faults identified within final logical diagnostic list 140 relative to actual physical data associated with the nets comprising such potential bridging faults.

Pruning module 80 evaluates each potential bridging fault contained within final logical diagnostic list 140, or a subset thereof, by applying adjacency criteria including defect size, defect size probability and design rules for circuit 20 in order to evaluate the physical probability that a potential bridge fault exists. The adjacency criteria algorithm so generated by criteria generator 150 is used by pruning module 180, together with physical information on the location and dimensions of each net within circuit 20 that is received from physical database 70, to construct pruned diagnostic list 160.

More specifically, pruning module 80 is operable to receive final logical diagnostic list 140 and its ranked logical list of potential bridge faults, associate the physical data corresponding to the nets making up each potential bridging fault, and then apply the adjacency criteria algorithm to determine the potential for a bridging fault based on physical data, defect size distribution and specific design rules. One adjacency criteria algorithm involves applying simulated polygon overlays between two particular nets making up a potential bridging fault. The overlays are configured in response to a particular defect size, and/or particular design rules, to evaluate the probability that bridging between the two nets has occurred.

Pruning module 80, may, for example, employ polygon overlays with an adjacency criteria algorithm whereby a defect of a particular size is overlaid between the two nets making up a potential bridge to determine if a defect of that particular size would cause a bridging fault between the two particular nets. If such a defect could cause a bridging fault between the two particular nets, the determination is weighted using the probability that a defect of that size exists to determine a final probability or ranking that particular bridging fault exists. For example, a polygon overlay can be employed to evaluate whether a defect of a particular size would bridge the distance between a net located in layer three of a particular circuit and a net located in layer six of the circuit. Polygon overlays can be employed that are configured in any particular size, shape, or orientation. Likewise, the adjacency criteria algorithm may employ simple proximity algorithms that merely measure distance between nets.

Design rules may also be used in configuring the adjacency criteria algorithm. For example, a particular defect may be 1.8 microns in diameter. Two nets may be 1.9 microns apart, seeming to indicate that no bridging fault is possible for that size defect. However, design rules specify that a pitch be used of 1.5 microns between the material comprising the two nets. Pruning module 80 may therefore indicate that a bridging fault is possible based on the fact that the 0.1 micron difference between defect size and net separation is less than the minimum required pitch between the two nets. Thus, although the defect may not cause a complete short between the two nets to cause a bridge fault, the defect may render the two layer of metallization so close as to create cross-talk or parasitic capacitances, for example, that would negatively impact circuit performance.

Pruning module 80 thus prepares pruned diagnostic list 160 that includes a newly ranked list of potential bridging faults between two nets that is both logically and physically probable given the comparison of final logical diagnostic list 140 to the physical data from physical database 70. Thus, a logically and physically accurate picture of the circuit performance is available to be presented to a design, testing or manufacturing team for identifying particular failure or defect in a circuit via optical microscopy, liquid crystal techniques, emission microscopy, electronic beam probing, resistive contrast imaging, or charge-induced voltage alteration.

It should be noted that pruning module 80 is not analyzing potential bridging faults between every combination of nets within circuit 20, but only those bridging faults associated with nets identified within final logical diagnostic list 140, or a subset of such nets as determined by the ranking of such nets in the final logical diagnostic list 140. For example, in a circuit containing perhaps over 200,000 nets, pruning module 80 would, if not restricted to the bridges found within final logical diagnostic list 140, be performing polygon overlays and/or other adjacent criteria processing for over forty billion potential bridging faults. However, pruning module 80, using the current invention, can be configured to only process a preset number of most likely potential bridging faults in final logical diagnostic list 140. Thus, the amount of processing time required for pruning module 80 to prepare a pruned diagnostic list is substantially reduced using the above identified analysis.

FIG. 8 is a flow chart summarizing a method of pruning a bridging diagnostic list according to the teachings of the present invention. In step 200, test administrator 50 generates test patterns designed to test stuck-at faults in each net a circuit 20. In step 210, test administrator 50 creates stuck-at fault dictionary 100 including expected responses for comparison to the generated resultant vectors of one or more test patterns associated with a stuck-at fault at a particular net in circuit 20. In step 220, test administrator SO applies such test patterns to circuit 20 in tester 40. In step 230, test administrator 50 obtains resultant vectors from tester 40. Next, in step 240, test administrator 50 constructs initial logical diagnostic list 120 using the resultant vectors. In step 250, diagnostic tool 60 generates composite dictionary 130 of potential bridging faults from initial logical diagnostic list 120 and stuck-at fault dictionary 100. Next, in step 260, diagnostic tool 60 uses the resultant vectors from tester 40 and composite dictionary 130 to construct final logical diagnostic list 140 that includes potential bridging faults in a ranked listing corresponding to the predicted logical probability of each bridging fault being present. In step 270, pruning module 80 receives physical data from physical database 70 that gives the geographic location and dimensions of each net within circuit 20. In step 280, pruning module 80 generates or obtains an adjacency criteria algorithm that may or may not be specific to circuit 20. In step 290, pruning module 80 prunes the final logical diagnostic list to derive a pruned diagnostic list 160 in response to applying the adjacency criteria algorithm to the nets of the potential bridging faults identified in final logical diagnostic list 140 in response to the physical likelihood of such bridging faults given probable defect sizes, design rules, and net locations.

FIG. 9 is a more detailed flow chart of a method for pruning final logical diagnostic list 140. In step 300, pruning module 80 receives the defect size distribution of potential defects within circuit 20. In step 310, pruning module 80 constructs design rules based on known characteristics of circuit 20 and restrictions imposed by the design team of circuit 20. In step 320, pruning module 80 generates an adjacency criteria algorithm based on the defect size distribution and the constructive design rules. In step 330, pruning module 80 applies the adjacency criteria algorithm to nets of the potential bridging faults identified in final logical diagnostic list 140 based on the physical data received from physical database 70. In step 340, pruning module 80 prunes final logical diagnostic list 140 in response to the results obtained from applying adjacency criteria algorithm to physical data associated with the nets of potential bridging faults. Thus, pruned diagnostic list 160 includes a ranked list of potential bridging faults that are both logically and physically probable.

Although the present invention and its advantages have been described in detail, it should be understood that various changes, substitutions, and alterations can be made therein without departing from the spirit and scope of the invention as defined by the appended claims.

What is claimed:

1. A method of automated defect localization in the testing of semiconductor integrated circuits, comprising the steps of:

creating a final logical diagnostic list of potential bridging faults in response to testing the circuit for stuck-at faults at a plurality of nets of the circuit, each potential bridging fault being associated with at least two tested nets of the circuit;

receiving physical data associated with each of the tested nets of the circuit;

applying adjacency criteria to the physical data associated with the at least two tested nets that are associated with each of the listed potential bridging faults;

generating the pruned diagnostic list of potential bridging faults in response to applying the adjacency criteria;

performing in-line inspection of the integrated circuits to obtain second localized probable defect data; and correlating the pruned diagnostic list of potential bridging faults with said second localized probable defect data.

2. The method of claim 1, wherein the step of creating a final logical diagnostic list comprises:

generating test patterns for testing the circuit;

creating a stuck-at fault dictionary having a list of nets for the circuit;

applying the test patterns to the circuit and generating resultant vectors;

creating an initial logical diagnostic list of tested nets of the circuit in response to the resultant vectors;

generating a composite dictionary in response to the stuck-at fault dictionary and the initial logical diagnostic list, the composite dictionary including a list of a plurality of potential bridging faults between one of the tested nets in the initial logical diagnostic list and another net of the circuit; and creating the final logical diagnostic list using the resultant vectors and the composite dictionary, the final logical diagnostic list ranking the potential bridging faults in order of logical probability.

3. The method of claim 1, wherein receiving physical data comprises receiving data specifying the geographic location of each of the tested nets in the circuit.

4. The method of claim 1, wherein receiving physical data comprises receiving the horizontal dimensions of each of the tested nets of the circuit.

5. The method of claim 1, wherein applying adjacency criteria comprises:

receiving design rules for the circuit; and applying the design rules to the physical data associated with the at least two tested nets associated with each of the potential bridging faults.

6. The method of claim 1, wherein applying adjacency criteria further comprises:

receiving defect size distribution data; and applying the defect size distribution data to the physical data associated with the at least two tested nets that are associated with each of the potential bridging faults.

7. The method of claim 1, wherein applying adjacency criteria comprises applying polygon overlays to the physical data associated with the at least two tested nets that are associated with each of the potential bridging faults.

8. The method of claim 1, wherein creating a pruned diagnostic list comprises:

assigning a probability to the physical likelihood of each of the potential bridging faults occurring in response to applying the adjacency criteria to the at least two nets associated with each potential bridging fault; and creating the pruned diagnostic list of the potential bridging faults in response to the assigned probability.

9. The method of claim 1, wherein creating a final logical diagnostic list of potential bridging faults comprises:

ranking a plurality of potential bridging faults in response to testing the circuit for stuck-at faults at a plurality of nets of the circuit, each potential bridging fault being associated with at least two tested nets of the circuit; and creating the final logical diagnostic list in response to the ranking.

10. The method of claim 1, wherein creating a pruned diagnostic list comprises:

assigning a probability to the physical likelihood of one of the potential bridging faults occurring in response to applying the adjacency criteria to the at least two nets associated with the potential bridging fault; and creating the pruned diagnostic list of potential bridging faults in response to the assigned probability and the final logical diagnostic list.

* * * * *